(12) United States Patent
Dupont

(10) Patent No.: US 8,969,780 B2
(45) Date of Patent: Mar. 3, 2015

(54) CMOS CIRCUIT FOR SENSOR WITH REDUCED READ NOISE

(75) Inventor: Benoit Dupont, Schaarbeek (BE)

(73) Assignees: Caeleste CVBA, Antwerp (BE); Benoit Dupont, Schaarbeek (BE)

( * ) Notice: Subject to any disclaimer, the term of this patent is extended or adjusted under 35 U.S.C. 154(b) by 446 days.

(21) Appl. No.: 13/524,542

(22) Filed: Jun. 15, 2012

(65) Prior Publication Data

US 2013/0334399 A1 Dec. 19, 2013

(51) Int. Cl.
*H01L 27/00* (2006.01)

(52) U.S. Cl.
USPC ....................... 250/214 R; 348/302

(58) Field of Classification Search
CPC ........... H04N 5/335; H04N 3/14; H01L 21/00
USPC .................... 250/214 R, 208.1; 348/300–308
See application file for complete search history.

(56) References Cited

U.S. PATENT DOCUMENTS

| 7,554,071 | B2 * | 6/2009 | Moholt | 250/214 R |
| 7,634,157 | B1 * | 12/2009 | Richards et al. | 382/305 |
| 7,787,033 | B2 * | 8/2010 | Rossi et al. | 348/244 |
| 7,804,536 | B2 * | 9/2010 | Blerkom | 348/296 |

* cited by examiner

*Primary Examiner* — Seung C Sohn
(74) *Attorney, Agent, or Firm* — Bacon & Thomas, PLLC

(57) ABSTRACT

A CMOS image sensor having one or more pixels, e.g. in an array, whereby each of the pixels having two or more sub-pixel elements for generating charge according to incident light intensity as well as a common charge sensitive device such as an amplifier coupled to two or more sub-pixel elements of a respective pixel. Charges generated by the two or more sub-pixel elements are added and integrated over respective integration time periods, to provide a signal representing the integrated charges. The circuit can be configured so that the two or more sub-pixel elements have different integration time periods. By combining charges at the charge sensitive device rather than combining outputs of multiple such devices, the amount of read noise can be reduced.

20 Claims, 11 Drawing Sheets

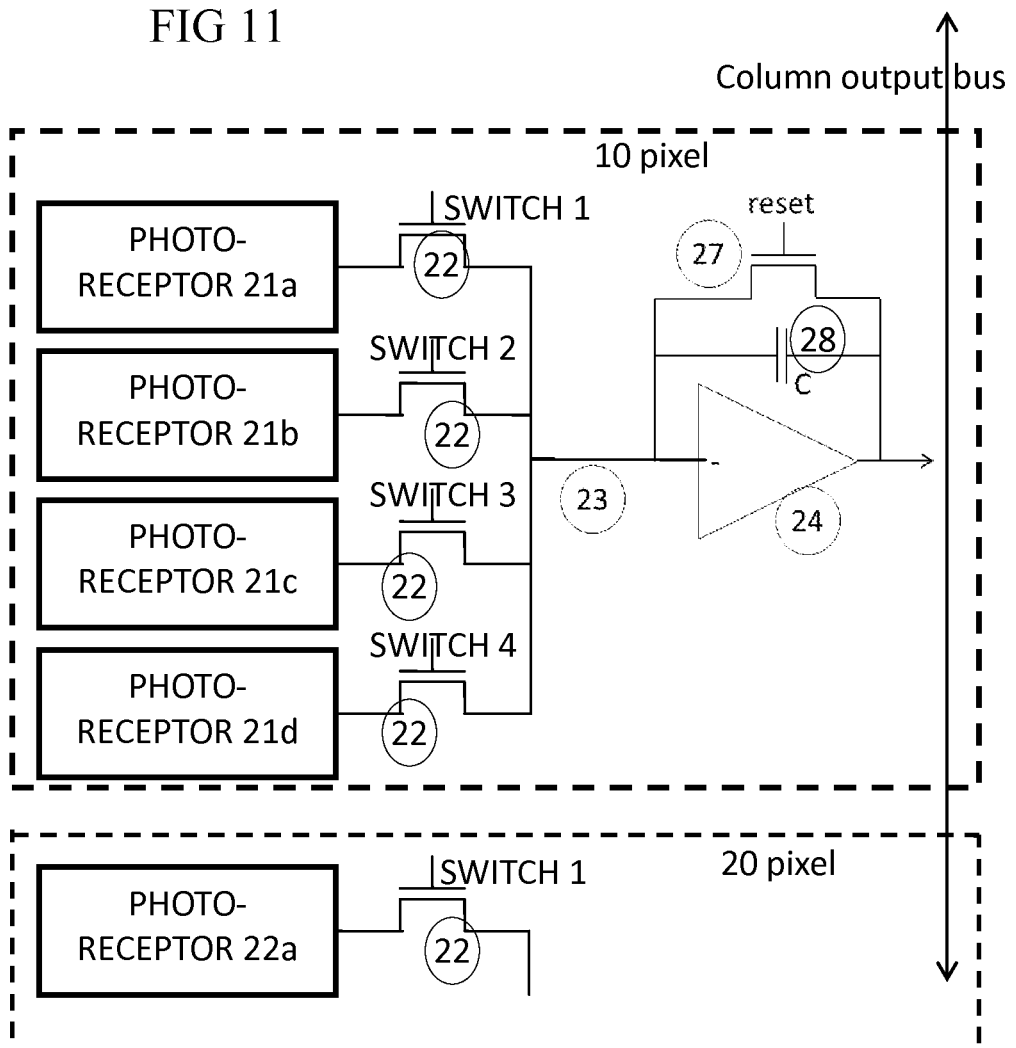

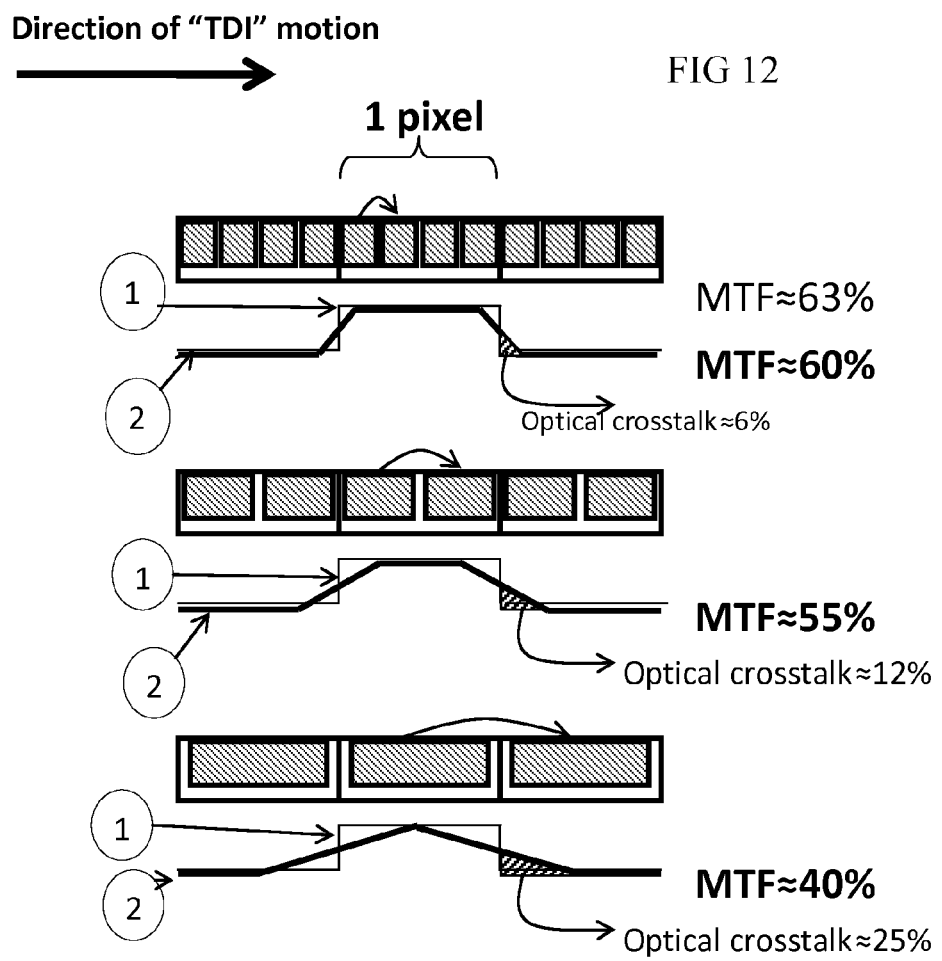

US 8,969,780 B2

CMOS CIRCUIT FOR SENSOR WITH REDUCED READ NOISE

FIELD OF THE INVENTION

This invention relates to CMOS circuits for image sensors, and to methods of using such circuits and to image sensors having the CMOS circuits.

DESCRIPTION OF THE RELATED ART

It is known to provide image sensors using CCD (Charge coupled device) technology of CMOS technology. One known mode of operation of CCD sensors is to use time delay integration (TDI). This is a method of operating CCDs in a scanning imaging setup, where the motion of the charge in the CCD structure is geometrically synchronous with the optical image as moves over the CCD.

See for example http://en.wikipedia.org/wiki/Time_Delay_and_Integration

Although the original TDI method makes use of a very specific feature of CCD, namely the capability to move charge packets, one has attempted to create CMOS image sensors equivalents of TDI, as described in U.S. Pat. No. 6,906,749. As in a CMOS imager one cannot freely move charge packets, the TDI operation is emulated by summing signals obtained by pixels in a two dimensional array, in a way that it realizes geometrical synchronicity between the summed pixel signals and the motion of the optical image over the sensor.

SUMMARY OF THE INVENTION

An object of the invention is to provide improved apparatus or methods. According to a first aspect, the invention provides: a CMOS circuit for an image sensor, the circuit having: one or more pixels, each of the pixels comprising two or more subpixel elements for generating charge according to incident light intensity, and a common charge sensitive device coupled to two or more subpixel elements of a respective pixel, so as to add the charges generated by the two or more subpixel elements, integrated over respective integration time periods, to provide a signal representing the integrated charges, the circuit being configured so that the two or more subpixel elements have different integration time periods.

By combining charges at the charge sensitive device rather than combining outputs of multiple such devices, the amount of read noise can be reduced. By having different integration time periods for the sub pixel elements, better detection of some image features is possible, such as reduced smearing of movement of the image or more sensitive detection of particular colors for example.

Any additional features can be provided in different embodiments, and some are described below in more detail.

The circuit can be configured so that the different integration time periods are overlapping in time. This can help to provide better detection of moving images for example.

The circuit can be configured such that the subpixel elements are arranged along an axis, and the integration time periods are shifted in time relative to each other according to locations along the axis of the corresponding subpixel elements. This can help enable TDI operation where the relative time shifts of the integration periods match a displacement of the image along the axis.

In some embodiments there are two or more pixels along the axis, and circuitry configured to combine the signals from the pixels according to the relative motion along the axis.

In some embodiments the circuit can be configured to have one common charge sensitive device per pixel. This can help minimize the amount of or simplify circuitry, though it is possible to have more than one per pixel, for example to enable faster operation if they are coupled to read in parallel. In other embodiments there can be a common charge sensitive device per group of pixels whereby the group of pixels is smaller than a row of pixels in the image sensor. The group can be larger than two pixels.

The circuit can have reset circuitry coupled to the common charge sensitive device and the common charge sensitive device can be configured for correlated double sampling operation to provide a reset level output before the integration periods and provide the signal after the integration periods.

The circuit can be configured such that the integration over the respective integration time periods is carried out at the subpixel elements, and the integrated charge is transferred as a charge packet to the common charge sensitive device.

The circuit can be configured such that the charge generated by the subpixel elements is transferred continuously to the common charge sensitive device and integration over the respective integration time periods is carried out at the common charge sensitive device.

There can be a switch coupled one of the subpixel elements to interrupt the transfer of charges to the common charge sensitive device to control the timing of the respective integration period. This is one way to control the integration periods directly, and the switch can in principle be located at the subpixel element, at the input of the common charge sensitive device, or anywhere in between.

The circuit can have a line of pixels, to form a line sensor, the subpixel elements for each respective pixel being arranged along an axis perpendicular to the line of the pixels.

Another aspect provides a method of using a CMOS circuit for sensing an image, the CMOS circuit having one or more pixels, each of the pixels comprising two or more subpixel elements for generating charge according to incident light intensity, and the method having the steps of generating the charges, integrating the charges over respective integration time periods so that the two or more subpixel elements have different integration time periods and adding the charges generated by different ones of the subpixel elements over different time periods at a common charge sensitive device so as to provide a signal representing the charges for all or part of a pixel.

The integrating can be carried out so as to have the different integration time periods being overlapping in time.

The method can involve having the integration time periods being shifted in time relative to each other according to locations of the corresponding subpixel elements along an axis, such that the relative time shifts of the integration periods are synchronized to a displacement of the image along the axis.

The sensing can involve correlated double sampling by providing a reset level output before the integration periods and outputting the signal after the integration periods.

In some cases the integration over the respective integration time periods can be carried out at the subpixel elements, and the integrated charge can be transferred as a charge pulse to the common charge sensitive device.

In other cases the charge generated by the subpixel elements can be transferred continuously to the common charge sensitive device and integration over the respective integration time periods can be carried out at the common charge sensitive device.

The present invention also provides an image sensor having CMOS circuits according to any embodiment of the present invention and an array of pixels. This image sensor can have a common charge sensitive device per group of pixels whereby the group of pixels is smaller than a row of pixels in the image sensor. Alternatively Tte image sensor can have one of the common charge sensitive devices per pixel.

Any of the additional features can be combined together and combined with any of the aspects. Other advantages will be apparent to those skilled in the art, especially over other prior art. Numerous variations and modifications can be made without departing from the claims of the present invention. Therefore, it should be clearly understood that the form of the present invention is illustrative only and is not intended to limit the scope of the present invention.

BRIEF DESCRIPTION OF THE DRAWINGS

How the present invention may be put into effect will now be described by way of example with reference to the appended drawings, in which:

FIG. 11 shows a schematic view of an embodiment similar to that of FIG. 6, but having photo receptors and a CTIA for the charge sensitive device, and FIG. 12 shows a comparison of signal outputs for pixels having 4, 2 or 1 subpixel elements per pixel along an axis of motion.

DESCRIPTION OF THE PREFERRED EMBODIMENTS

Figure 1:
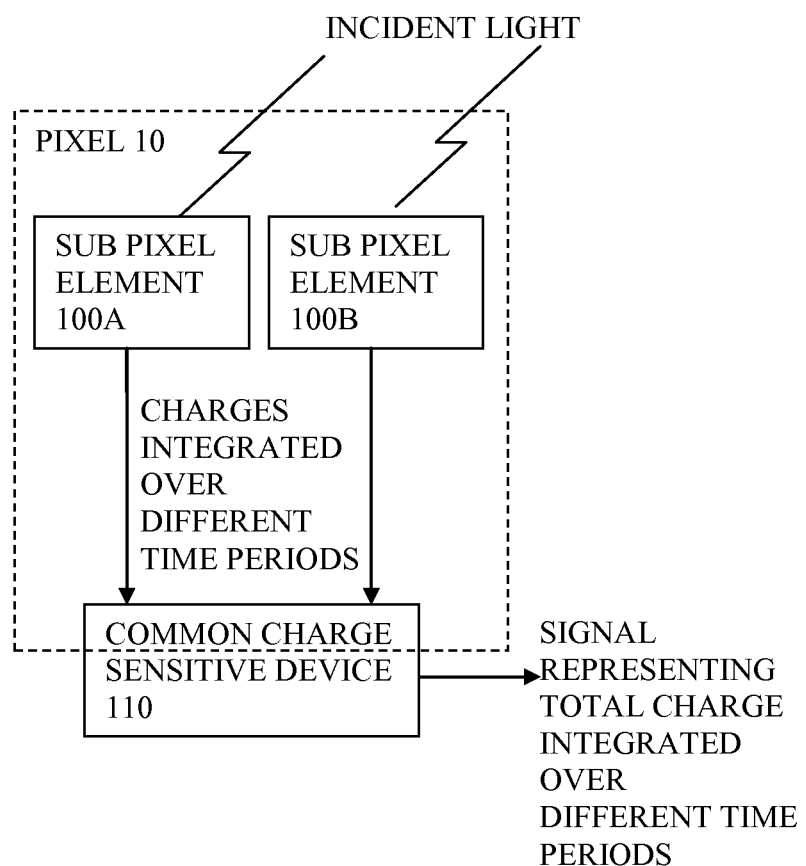
FIG. 1 shows a schematic view of circuitry according to an embodiment.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

The term "comprising", used in the claims, should not be interpreted as being restricted to the means listed thereafter; it does not exclude other elements or steps.

Thus, the scope of the expression "a device comprising means A and B" should not be limited to devices consisting only of components A and B. It means that with respect to the present invention, the only relevant components of the device are A and B.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

CMOS processing is first described in an early form in U.S. Pat. No. 3,356,858. The processing creates a structure that has complementary-symmetry which refers to the fact that the typical digital design style with CMOS uses complementary and symmetrical pairs of p-type and n-type transistors for logic functions which can be metal oxide semiconductor field effect transistors (MOSFETs). "Metal-oxide-semiconductor" refers to the physical structure of certain field-effect transistors, having a metal gate electrode placed on top of an oxide insulator, which in turn is on top of a semiconductor material. In the early fabrication processes, the gate electrode was made of aluminum. Later CMOS processes switched to polycrystalline silicon ("polysilicon"), which can better tolerate the high temperatures used to anneal the silicon after ion implantation. This means that the gate can be put on early in the process and then used directly as an implant mask producing a self aligned gate (gates that are not self aligned require overlap which increases device size and stray capacitance). Metal gates can be used in conjunction with with a high-k dielectric material for the gate to combat increasing leakage currents.

In the present invention "CMOS" refers a family of processes used to implement circuitry, e.g. on integrated circuits. A CMOS circuit is the circuitry created by such processes. CLOS circuitry is an established major class of integrated circuits.

These processes also make use of certain materials which are common for CMOS processing. Although CMOS logic can be implemented with discrete devices, typical commercial CMOS products as envisaged for the present invention are integrated circuits composed of many transistors of both types on a piece of semiconductor material such as silicon.

Embodiments of the present invention a CMOS imaging device which is a digital device as far as signal processing is concerned. Such a device can include an active pixel sensor made using the CMOS semiconductor process. Extra circuitry next to each photo sensor converts the light energy to a voltage. Additional circuitry may be included to convert the voltage to digital data. A CMOS device should be differentiated from a CCD image sensor which is an analog device.

An active-pixel sensor (APS) is an image sensor consisting of an integrated circuit containing an array of pixel sensors, each pixel containing a photodetector and an active amplifier. A CLOS active pixel sensors is produced by a CMOS process.

With respect to the term "pixel", a pixel as understood in the present invention can contain sub-pixels, whereby the sub-pixels contribute to the signal from the pixel. In embodiments a sensor array has pixels and as a line scanner has a frame time (line time) which is equal or larger than the "integration time". The maximum integration time is thus approximately equal to the line time.

In embodiments of the present invention a pixel has an extent that corresponds to the distance the image travels over the line scan imager (during scanning in orthogonal direction to the line orientation) during the "line time". This applies to a TDI imager but also to a simple line scanner. A subpixel is hence smaller than the distance traveled during the line time.

Optionally in embodiments of the present invention a sub-pixel's information is not read out separately, yet signals from several sub-pixels of a pixel are combined inside the pixel before the pixel's signal is read out.

Also, in most embodiments of the present invention, a practical implementation is that the pixels are square or square-like in shape, whereas the sub-pixels are rectangles but any shapes can be used that tile correctly. Also in embodiments of the present invention a subpixel can contain one photoelectronic device such as a photodiode.

In embodiments of the present invention a sub-pixel can have a single integration time. A pixel can contain sub-pixels that have different integration times and that may overlap and who's signals are accumulated/added/summed in the pixel.

With reference to the term "charge sensitive device", in embodiments of the present invention this can be any type of charge sensitive active device such as an amplifier, that converts an amount of charge to a different unit as voltage or current or frequency etc. An example is a CTIA (charge transimpedance amplifier), a CFA (charge feedback amplifier), floating diffusion galvanometers, or any other device or method of this type known to persons skilled in the art.

Correlated double sampling operation (CDS) refers to a method to measure electrical values such as voltages or currents that allows removing an undesired offset. It is used often when measuring sensor outputs. The output of the sensor is measured twice: once in a known condition and once in an unknown condition. The value measured from the known condition is then subtracted from the unknown condition to generate a value with a known relation to the physical quantity being measured.

In the description provided herein, numerous specific details are set forth. However, it is understood that embodiments of the invention may be practiced without these specific details. In other instances, well-known methods, structures and techniques have not been shown in detail in order not to obscure an understanding of this description.

Issues with Known Devices

Although the known CMOS implementation of TDI is functional, it still has some shortcomings compared to a CCD TDI.

1. The noise disadvantage: in CCD, the read noise happens once, on final readout of the summed charge, as the summation (addition) of charges itself is noise free. In all prior CMOS implementation, the acquisition and summation of each intermediate pixel signal incurs read noise. In the best case, when each of these read noises are uncorrelated, the noise in a CMOS TDI grows as the square root of the number of TDI stages.

2. Sub-pixel motion. A 4 or 3 phase CCD shifts the charge in steps of ¼ or ⅓ pixel, thus following accurately the optical image motion, and thus resulting in minor MTF degradation. In a typical CMOS TDI, there is no sub pixel motion, or, if sub pixel motion is implemented, it comes with a penalty in noise, as the number of elementary reads increases.

Introduction to Features of Embodiments

The subject of some embodiments of the invention is a pixel and image sensor with such pixels, and method to operate it. In some cases this can use Time Delay and Integration (TDI) operation in a CMOS technology. Some embodiments enable sub pixel motion in CMOS, without noise penalty, thereby rivaling the established best in class performance of CCD based TDI. Applications can extend to any applications where CCD TDI is used, such as for scanning applications with strong requirements for light sensitivity, such as in remote sensing or earth observation, various fields of scientific imaging, various application of industrial imaging, in particular where a scanning movement is required. However many other imaging domains may benefit including medical imaging, automotive imaging, machine vision, etc. Notably subpixel motion can be sensed, while not having the noise disadvantage for reading each of the sub pixel elements individually. Other applications can be envisaged not involving image motion or TDI, such as when using a scanning single line image sensor FIG. 1 shows a schematic view of circuitry according to an embodiment. In this figure, the circuitry has a pixel 10 which has two subpixel elements 100A and 100B. These generate electrical charge according to an amount of incident light. These charges are integrated over a time period, and fed to a common charge sensitive device. The time periods are different for the different charge sensitive devices. The time periods during which the charge is integrated can be controlled in various ways and in principle at any location, at the subpixel element, or at the charge sensitive device, or anywhere in between. The common charge sensitive device 110 can add the charges from the two subpixel elements, integrated over different time periods. There can of course be more than two subpixel elements per pixel. The amount of read noise can be reduced, and the different integration time periods can help enable better detection of some image features, with or without image motion. The subpixel elements can be implemented in various ways, and any type of charge sensitive device can be used. Examples of various ways of implementing these features will be described below. The charge sensitive device and the integration timing operation can in principle be located inside or outside the pixel, if the pixel is defined as the parts of the circuitry which are co-located with the light sensitive subpixel elements. If located outside the pixel, these parts can be co-located with corresponding circuitry for other pixels of the same column or row of an array for example.

Figure 2:
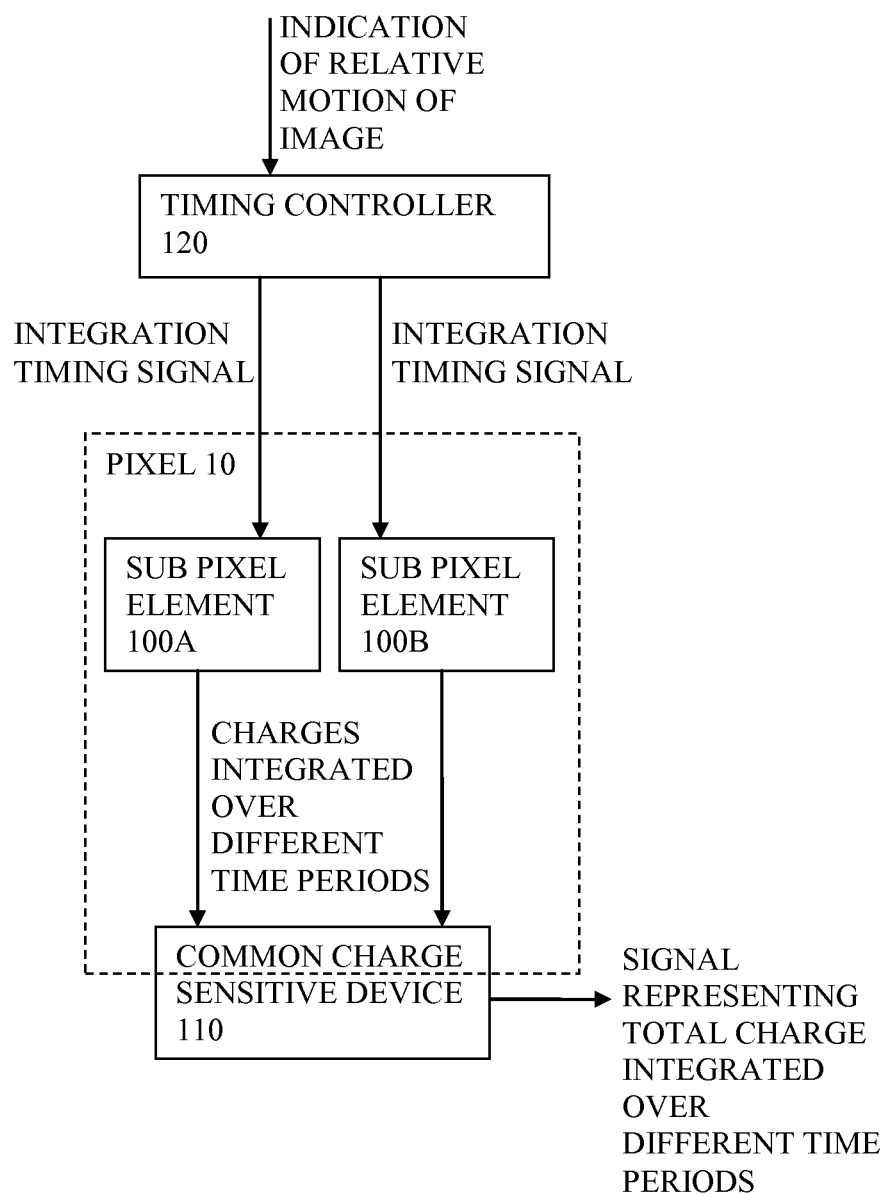
FIG. 2 shows a schematic view of circuitry according to an embodiment also having a timing controller.

FIG. 2 shows a schematic view of circuitry according to an embodiment similar to that of FIG. 1 and also having a timing controller 120 for providing integration timing signals. Similar reference numerals to those of FIG. 1 are used for corresponding features. The controller can be implemented using conventional digital logic circuitry or analog circuitry in principle. These signals can represent the start and finish of the integration time or only the finish time, and can indicate this by a logic transition or a pulse or any kind of code or frequency for example. These timing signals can be used to enable the subpixel elements or to control a switch or transfer gate at the output of the subpixel elements for example, or at the inputs of the charge sensitive device.

Figure 3:
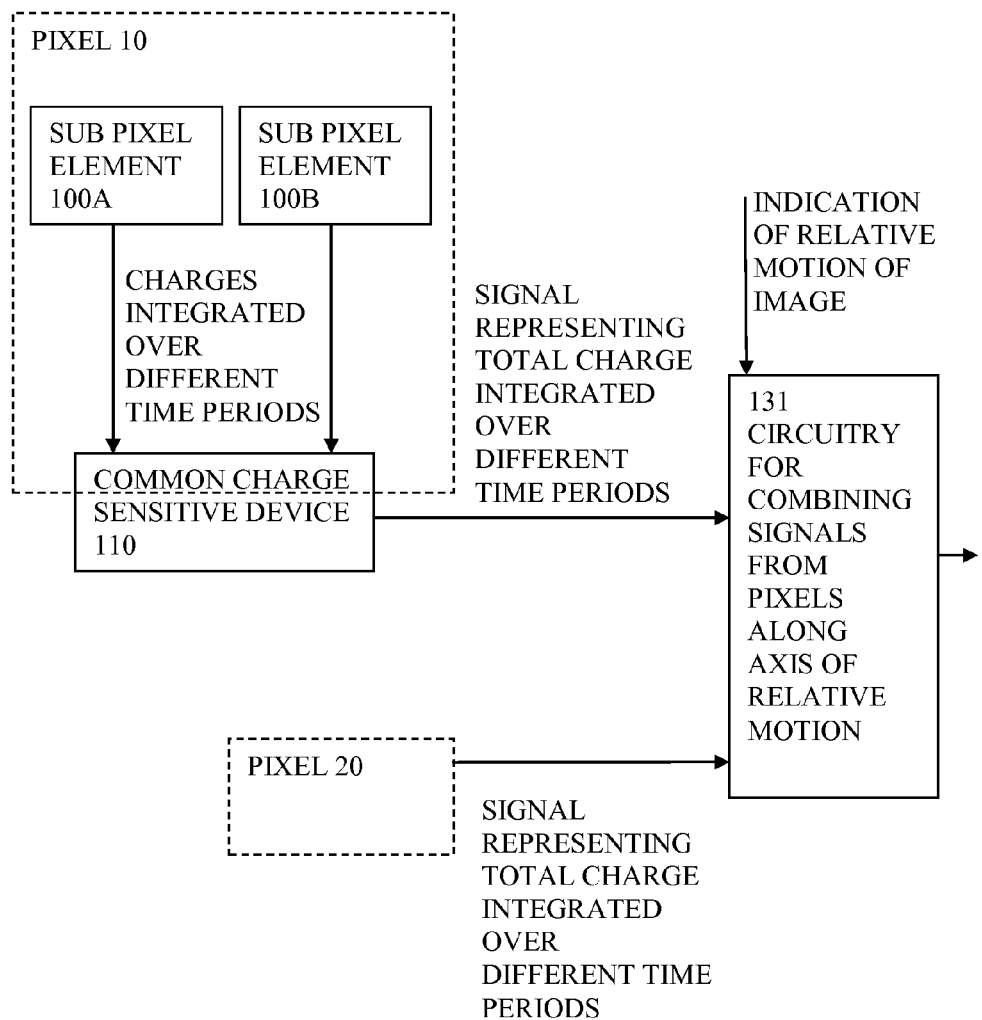
FIG. 3 shows a schematic view of circuitry according to an embodiment also having circuitry for combining signals from pixels along an axis of motion.

FIG. 3 shows a schematic view of circuitry according to an embodiment similar to that of FIG. 1 and also having circuitry 131 for combining signals from pixels along an axis of relative motion of the image. Similar reference numerals to those of FIG. 1 are used for corresponding features. For each pixel located in a line along an axis of relative motion of the image, a signal representing a total charge integrated over different time periods from different subpixels, is fed to the combining circuitry. In this figure two pixels are shown, pixel 10 and pixel 20 though of course there may be many more pixels. The circuitry for combining adds the signals together. There will be read noise from each of the charge sensitive devices, but adding the signals can still provide greater sensitivity. For TDI operation, which may or may not be used, there is an input indicating relative motion of the image. This enables the circuitry to combine the signals from each pixel with a delay corresponding to the relative motion of the image along the line of pixels. Thus the same point on the image is sensed by the different pixels at different times, and the resulting signals are combined to provide a stronger signal representing that point. The combination operation may be repeated at intervals for sensing successive points in the image along the axis of motion.

Figure 4:
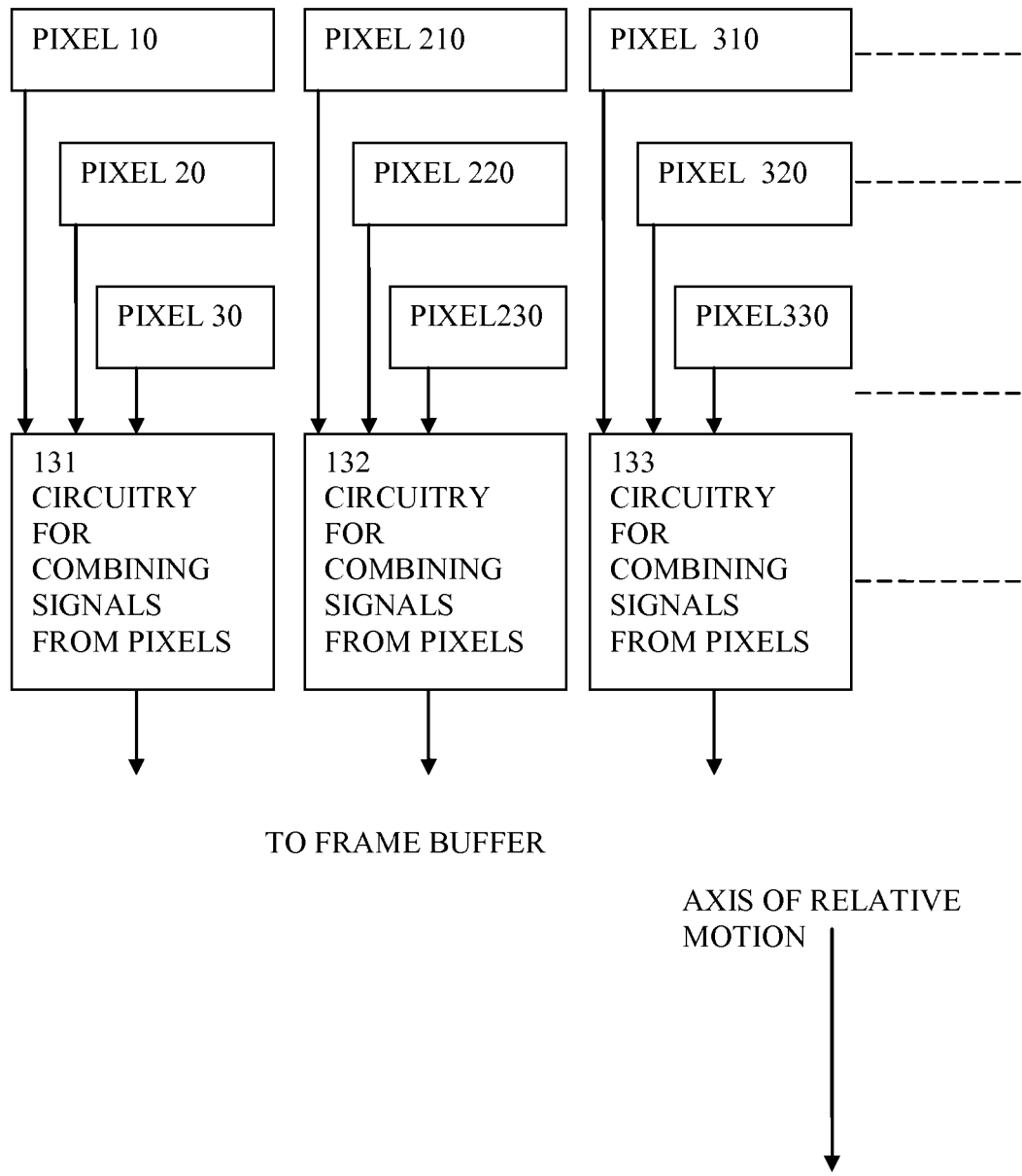
FIG. 4 shows an array of pixels according to embodiments.

FIG. 4 shows an array of pixels according to another embodiment. Three lines of pixels are shown, and three columns are shown, though there can be many more. An axis of motion is down the page for TDI operation for this example. A first column has pixels 10, 20 and 30, a second column has pixels 210, 220, 230, and a third column has pixels 310, 320 and 330. The first column has combining circuitry 131, for combining signals provided by pixels 10, 20 and 30. The second column has combining circuitry 132, for combining signals provided by pixels 210, 220 and 230. The third column has combining circuitry 133 for combining signals provided by pixels 310, 320 and 330. The combined signals for each column may go to a frame buffer for further processing.

Figure 5:
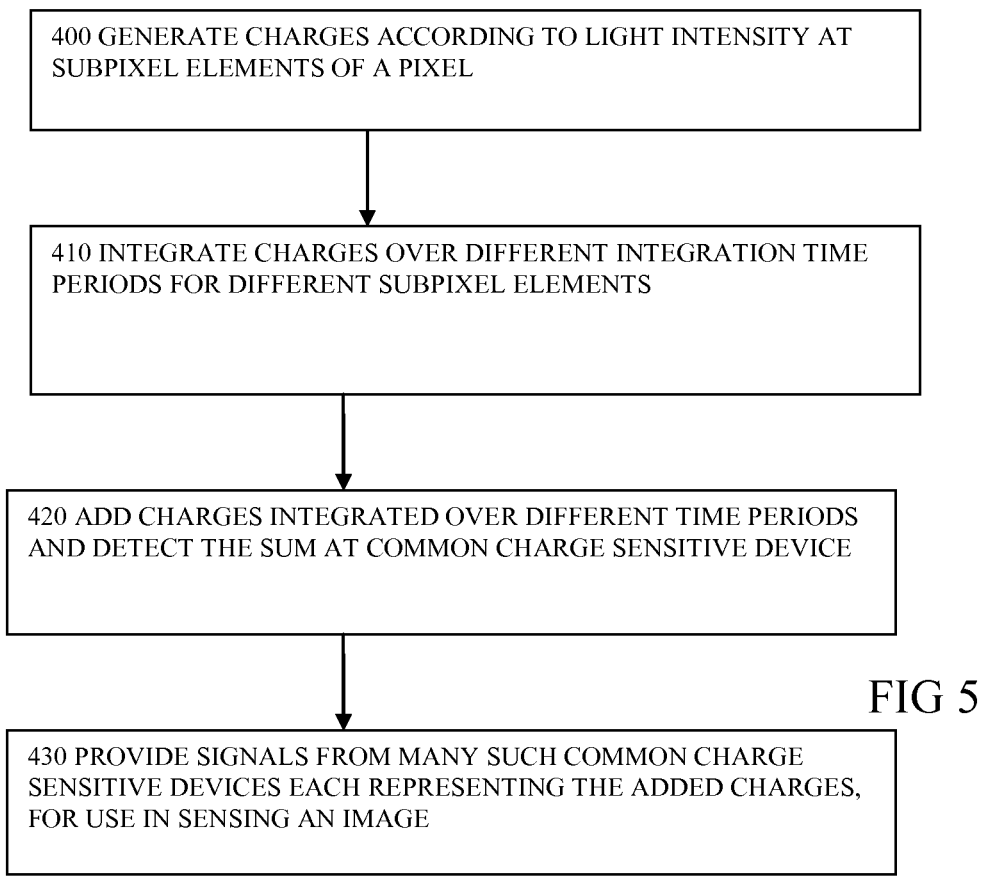
FIG. 5 shows steps of a method of sensing according to an embodiment.

FIG. 5 shows steps of a method of sensing according to an embodiment. At step 400, charges are generated according to light intensity at subpixel elements of each pixel. At step 410, charges from different subpixel elements are integrated over different time periods. At step 420 there is a step of adding the charges integrated over different time periods, and detecting the total at the common charge sensitive device. The adding can be done separately from the detecting, or done at the same time and location. At step 430 signals from many such common charge sensitive devices are provided, each representing the sum of charges, for use in sensing an image. These steps shown can be added to, or implemented in various ways.

FIG. 6

The circuitry can be realized by pixels using shared photoreceptors (such as a shared 4T pixels architecture well known to those skilled in the art) inside one TDI pixel, and accumulating the charges of the sub-pixels on a shared sense node, such as the shared floating diffusion, whereby the charges of the subpixels are transferred according the desired sub pixel motion. The integration times of the different sub pixels are relatively shifted in time.

Figure 6:
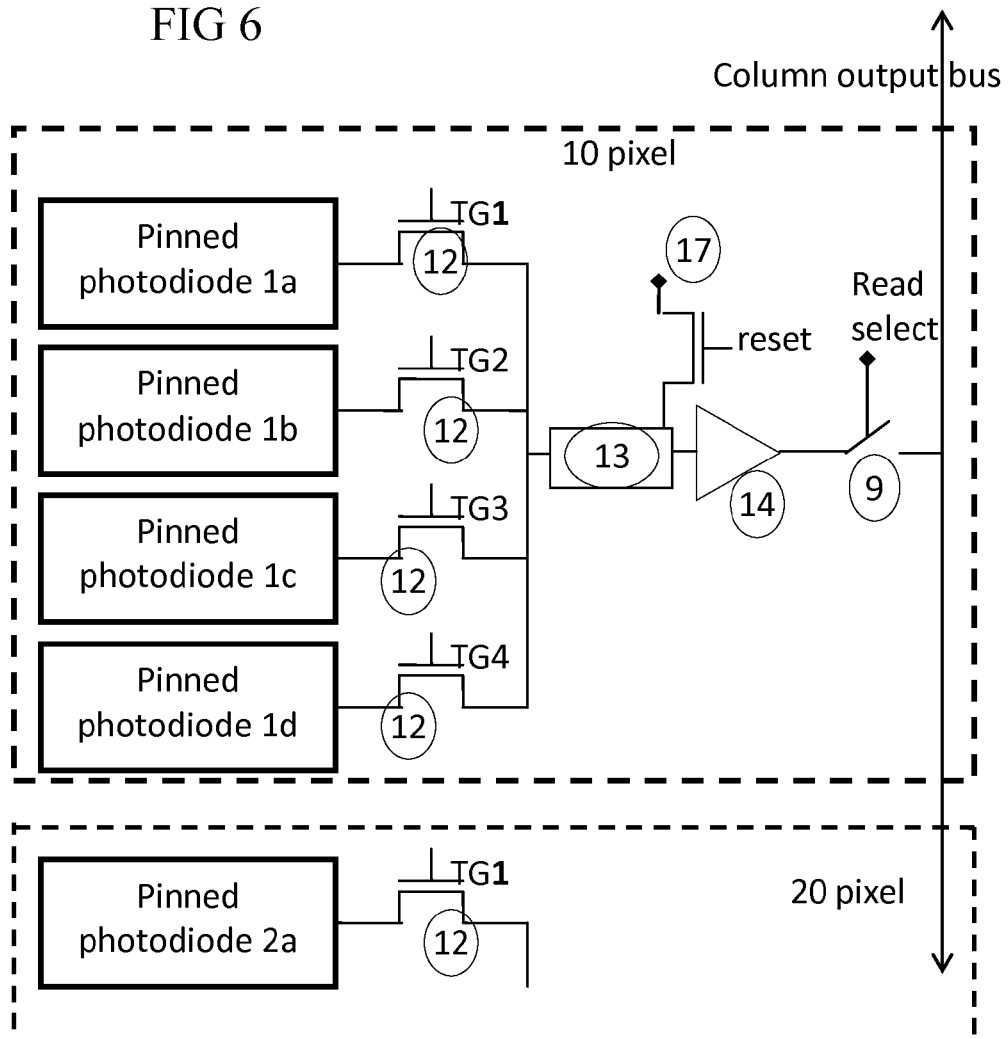
FIG. 6 shows a schematic view of circuitry according to an embodiment having pinned photodiodes, transfer gates and a column output bus.

FIG. 6 shows such a "4T shared pixel—like" implementation. In this case the subpixel elements are implemented in the form of pinned photodiodes (11). Four such subpixel elements are shown per pixel (10) are connected via transfer gates (12) to one floating diffusion (13) and buffer amplifier (14). An output of the buffer amplifier provides an output onto a column bus shared by a number of pixels. A reset switch (17) serves to reset the floating diffusion prior to charge accumulation. The transfer gates are operable to control the integration periods for each of the subpixel elements.

A timing controller as described above can be used to provide control signals for the transfer gates to set the integration timings. The floating diffusion part effectively adds the charges from the subpixel elements. The common charge sensitive device is implemented by the buffer amplifier having at its input the floating diffusion part.

Figure 7:
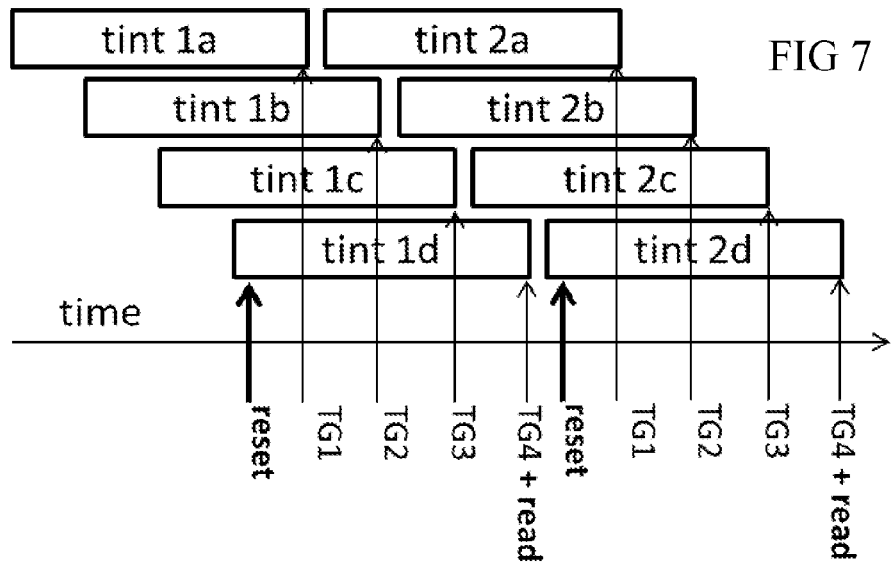
FIG. 7 shows a timing diagram showing integration periods for the embodiment of FIG. 6, shifted in time so as to overlap.

FIG. 7 shows a timing diagram showing integration periods for the embodiment of FIG. 6, shifted in time so as to overlap. It shows an example of relative timing of the transfergate pulses TG1 . . . TG4 occuring on the transfer gates (12) on the reset switches (17) and the time to readout the buffer (14). The effective time of the integration times of each of the sub pixels is then indicated: photodiode 1a has integration time 1 (Tint1a, photodiode 2c has Tint2c etc. Reset timings are shown as occurring between each sequence of transfer gate pulses. A read is shown at the end of the last integration period of the sequence, just before the reset.

Figure 8:
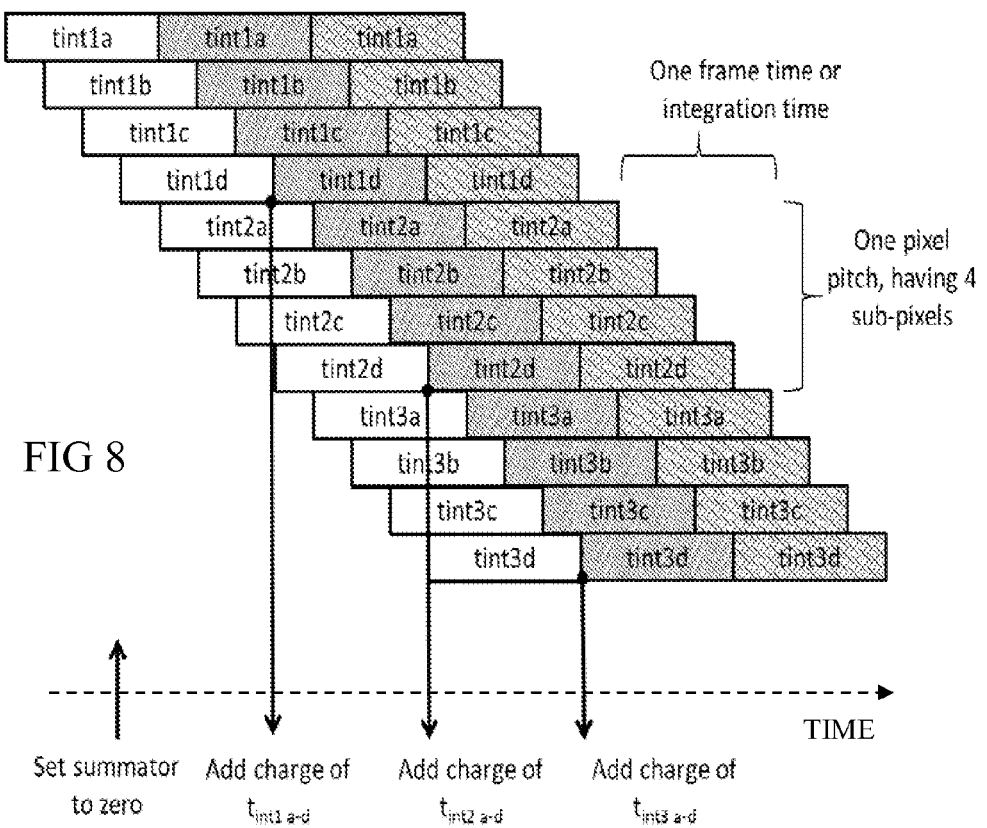
FIG. 8 shows a timing diagram also showing timings of add operations for adding charges.

FIG. 8 shows a timing diagram for a more extensive version of the circuitry having three rows of pixels, each pixel having 4 rows of subpixel elements. This also shows timings of add operations for adding charges accumulated during the integration times. Each horizontal line of the chart is the timings for a different one of the subpixel elements.

Figure 9:
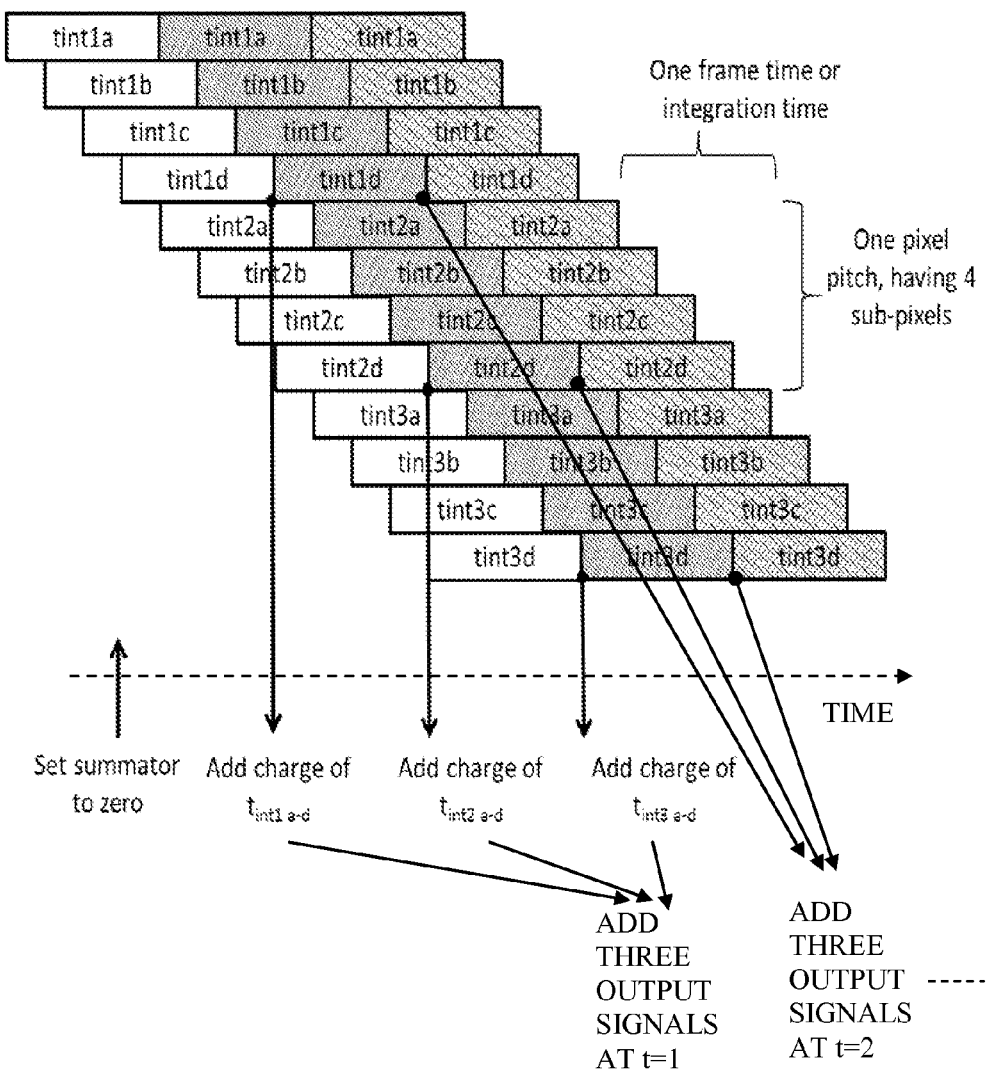
FIG. 9 shows a timing diagram similar to that of FIG. 8 and additionally showing timings of operations to combine signals from three or more pixels along an axis of motion.

FIG. 9 shows a timing diagram similar to that of FIG. 8 and additionally showing timings of operations to combine signals from three or more pixels along an axis of motion, using for example the circuitry foe combining, as shown in FIG. 3.

Figure 10:
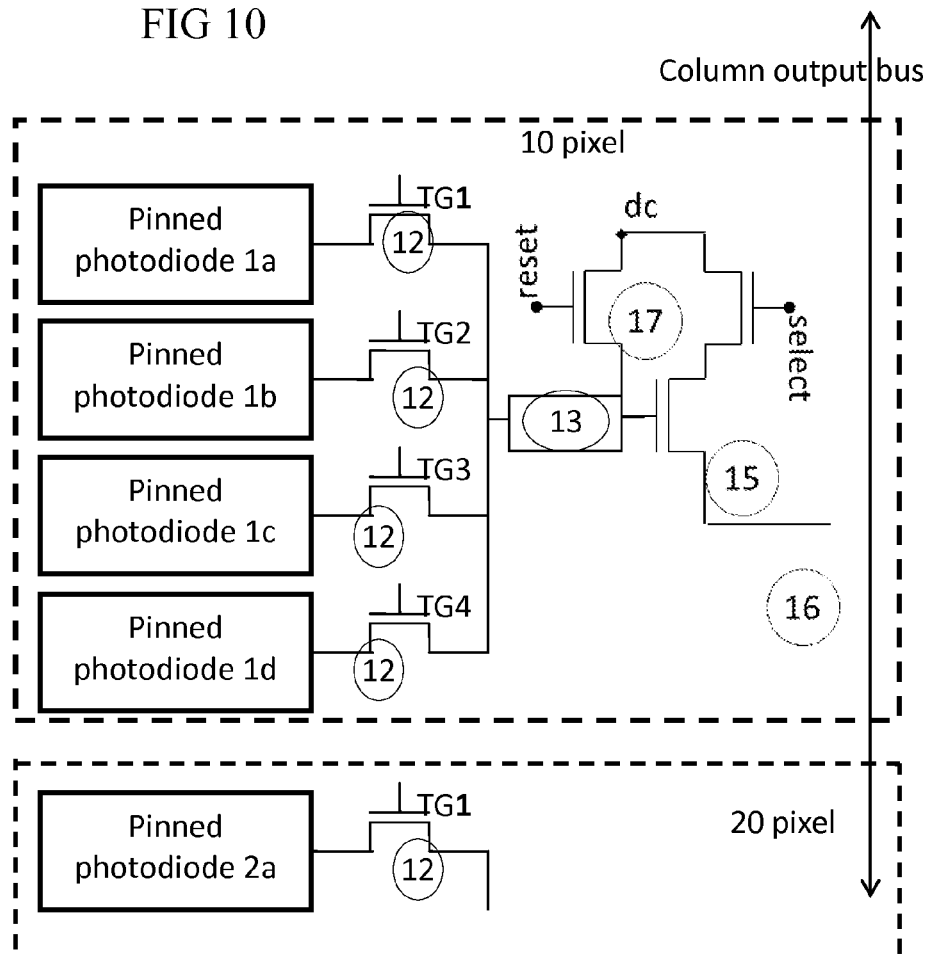
FIG. 10 shows a schematic view of an embodiment similar to that of FIG. 6, but having a source follower circuit as an output buffer.

FIG. 10 shows 4T shared pixel schematic variant of the embodiment of FIG. 6. The buffer amplifier (14) of the charge sensitive device is implemented as a source follower (15) driving an output bus (16).

In more general standpoint one can implement this as a pixels with contains a number of photoreceptors that are by sequentially closes switches to a common charge sensitive amplifier.

In the more general case, this applies to all kind of photoreceptors that can be read by a charge sensing amplifier of buffer:

⇒ Semiconductor photo diodes, in Silicon or other semiconductors
⇒ Heterojunction and Schottky barrier photodiodes
⇒ Photoresistors
⇒ Hybrids photoreceptors, by wire bond, bump bond, direct connections or otherwise
⇒ Bolo meters
⇒ Pyro-electric detectors
⇒ Avalanche photodiodes or SPADs
⇒ Vacuum tube photo detectors
⇒ Photomultiplier elements
⇒ Photoreceptors that are themselves composed of smaller entities, such as small arrays or groups of monolithic or hybrid-connected photoreceptors where multiple such are elementary photoreceptors are combined into one electrical node, or where one can disable (by fuse or programming) some of these elementary photoreceptors in case they are defect.

It applies also to all kinds of charge sensitive amplifiers, such as for example:
⇒ A floating diffusion amplifiers with a source follower as found in most CMOS pixels
⇒ An inverting charge transimpedance amplifiers (CTIA), consisting of an inversion amplifiers with a capacitive or nearly capacitive feedback.
⇒ Direct injection charge amplifiers, as used in photovoltaic or photoresistive IR imaging
⇒ Variants on the CTIA concepts, such as CTIAs with AC coupled input, with chopping amplifiers, or with JFETs or BJTs or other types of amplifying elements instead of MOSFETs.

FIG. 12 shows a representation of pixels and signals for TDI operation, the pixels being subdivided in 4, 2 and 1 subpixels respectively. In each of the three cases there is shown a representation of the pixels in cross section, above a plot of the effective pixel shape when the pixel is static or not moving (1), and another plot when the pixel is moving in TDI fashion (2).

Further notes:

In a special embodiment, "TDI" operation with subpixels motion is realized. One can imitate the sub pixels motion of TDI that is classically realized in a CCD.

In a special embodiment, the method of sub-pixel motion sensing can be realized and be useful in a single pixel row linear image sensor. For linear imagers that are used for scanning (such as in flatbed scanners or in push broom imager sensors), the sub pixel motion sensing can compensate the motion blur that is due to scanning motion.

Having sub-pixel resolution in the TDI operation can enable reducing the motion blur due to the step-wise displacement of the charges not matching the continuous displacement of the image over the pixel array. Sub-dividing the pixel and reading the data with fine granularity allows a reduction in such motion blur (unsharpness due to motion), or MTF, whereby MTF is generally as an often used figure of merit expressing unsharpness;

Data Rata and Data Volume.

The above advantage can be realized by brute force, and simple reading sub-pixels as if they were pixels of a smaller size. Yet in that case, the amount of data read, to be transferred, handled etc increases significantly too. The embodiments described can help to avoid creating so many subpixel elements to be read out.

Noise Performance

One can apply noise reduction techniques to the pixel's signal as a whole. One can apply the Correlated double sampling as follows: The reset level of the integrator is read before the first sub-pixels's charge is summed (added, transferred, etc), and one reads the final signal after the last sub-pixel's charge is summed (etc). This way of operation is superior to the noise and S/N obtained in the brute force way. Indeed, suppose that one reads for each pixels, say, 4 sub-pixels. According to state of the art, one can read these sub-pixels with a noise of say 2 electrons RMS. In post processing, the 4 sub-pixels taken at different times are software (or hardware) re-combined into one reading which has higher noise by a factor of root two, as the 4 signals are uncorrelated.

In the embodiment of FIGS. 6 and 7, the charge amplifier sees a charge packet arriving in 4 steps, yet, this does not affect the noise performance of the circuit. The noise added to the reading of the 4 sub-pixels combined is still 2 electronsRMS.

As described, the shift in time of the integration, times can be matched to a displacement in space of the image detail recorded by the subpixel. (=the TDI principle)

The overall signal (integrated value of charges) of the pixel can be readout to the outside world, then noise reduction techniques applied to the pixel's signal as a whole. The Correlated double sampling can be implemented if desired in some embodiments by
⇒ Reading the reset level of the csd before the first subpixel's charge is summed (arrives, added, transferred, etc),
⇒ reading the signal level after the last sub-pixel's charge is summed (arrives, etc).
⇒ taking the difference between the said reset and signal level; this difference can be made (as known to those people skilled in the art)
in the pixel itself
somewhere on chip in analog or digital domain
somewhere off-chip in analog or digital domain Other variations can be envisaged within the scope of the claims. For example, the number of TDI stages can be for example between 1 and several 100, with multiple subpixel elements in sub-rows. The pixels can each be a shared pinned photodiode pixel whereby the subpixel elements comprise pinned photodiodes plus their transfer gates. The pinned photodiodes can be connected to a common sense node (or floating diffusion) via switches. The subpixel elements can be for example photoreceptors (photodiodes, photoresistors, avalanche photodiodes, hybrid photoreceptors, bolometers, . . . ) connected via switches (which are transistors, or . . . ) to the input node (integration node, floating diffusion, charge sense node, current sense node) of an integrator circuit (source follower gate; charge or current integrator circuit; CTIA; CFA; or to any charge or current sensitive amplifier known to people skilled in image sensor design art).

The invention claimed is:

1. A CMOS circuit for a sensor, the circuit having:
one or more pixels (10,20), each of the pixels comprising two or more subpixel elements (100A, 100B) for generating charge according to incident light intensity, and
a common charge sensitive device (13, 24, 110) coupled to two or more subpixel elements of a respective pixel, so as to detect a sum of the charges generated by the two or more subpixel elements, integrated over respective integration time periods, to provide a signal representing the integrated charges, the circuit being configured so that the two or more subpixel elements have different integration time periods.

2. The CMOS circuit of claim 1, configured so that the different integration time periods are overlapping in time.

3. The CMOS circuit of claim 1, configured such that the subpixel elements are arranged along an axis, and the integration time periods are shifted in time relative to each other according to locations along the axis of the corresponding subpixel elements.

4. The CMOS circuit of claim 3 and having a timing controller (120) configured to receive an input indicating a relative motion of the image along the axis, and to control the integration time periods according to the relative motion.

5. The CMOS circuit of claim 4, having two or more pixels along the axis, and having circuitry (131, 132, 133) configured to combine the signals from the pixels according to the relative motion along the axis.

6. The CMOS circuit of claim 1, configured to have one of the common charge sensitive devices per pixel.

7. The CMOS circuit of claim 1 and having reset circuitry (17) coupled to the common charge sensitive device, the common charge sensitive device being configured for correlated double sampling operation to provide a reset level output before the integration periods and provide the signal after the integration periods.

8. The CMOS circuit of 1 claim, configured to carry out the integration over the respective integration time periods at the subpixel elements, configured to transfer the integrated charge as a charge pulse to the common charge sensitive device.

9. The CMOS circuit of claim 1, configured to transfer the charge generated by the subpixel elements to the common charge sensitive device and configured to carry out the integration over the respective integration time periods at the common charge sensitive device (24).

10. The CMOS circuit of claim 1, having a switch (22) coupled to one of the subpixel elements to interrupt the transfer of charges to the common charge sensitive device to control the timing of the respective integration period.

11. The CMOS circuit of claim 10, having a switch (22) coupled to one of the subpixel elements to interrupt the transfer of charges to the common charge sensitive device to control the timing of the respective integration period.

12. The CMOS circuit of claim 1, having a line of the pixels (10, 210, 310), to form a line sensor, the subpixel elements for each respective pixel being arranged along an axis perpendicular to the line of the pixels.

13. A method of using a CMOS circuit for sensing an image, the CMOS circuit having one or more pixels (10, 20), each of the pixels comprising two or more subpixel elements for generating charge according to incident light intensity, and the method having the steps of generating (400) the charges, integrating (410) the charges over respective integration time periods so that the two or more subpixel elements have different integration time periods adding (420) the charges generated by different ones of the subpixel elements over different time periods and detecting the sum at a common charge sensitive device so as to provide a signal representing the charges for all or part of a pixel.

14. The method of claim 13, the integrating being carried out so as to have the different integration time periods overlapping in time.

15. The method of claim 13 and having the integration time periods being shifted in time relative to each other according to locations of the corresponding subpixel elements along an axis, such that the relative time shifts of the integration periods are synchronized to a displacement of the image along the axis.

16. The method of claim 13, having the step of carrying out correlated double sampling by providing a reset level output before the integration periods and outputting the signal after the integration periods.

17. The method of claim 13, the integration over the respective integration time periods being carried out at the subpixel elements, and the integrated charge being transferred as a charge pulse to the common charge sensitive device.

18. An image sensor having CMOS circuits according to claim 1 and an array of pixels.

19. The image sensor of claim 18, having a common charge sensitive device per group of pixels whereby the group of pixels is smaller than a row of pixels in the image sensor.

20. The image sensor of claim 19 configured to have one of the common charge sensitive devices per pixel.

* * * * *